(12) United States Patent
Alriksson et al.

(10) Patent No.: US 8,797,965 B2
(45) Date of Patent: Aug. 5, 2014

(54) TECHNIQUE FOR AUTOMATIC GAIN CONTROL IN A MULTI-CARRIER COMMUNICATION SYSTEM

(75) Inventors: Peter Alriksson, Horby (SE); Joakim Axmon, Kavlinge (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 133 days.

(21) Appl. No.: 13/583,935

(22) PCT Filed: Mar. 18, 2011

(86) PCT No.: PCT/EP2011/054093
§ 371 (c)(1),
(2), (4) Date: Sep. 18, 2012

(87) PCT Pub. No.: WO2011/113919
PCT Pub. Date: Sep. 22, 2011

(65) Prior Publication Data
US 2013/0003584 A1    Jan. 3, 2013

Related U.S. Application Data

(60) Provisional application No. 61/318,530, filed on Mar. 29, 2010.

(30) Foreign Application Priority Data

Mar. 19, 2010   (EP) ..................................... 10002939

(51) Int. Cl.
*H04Q 7/00*   (2006.01)
*H04Q 7/24*   (2006.01)

(52) U.S. Cl.
USPC ............................................ 370/328; 370/338

(58) Field of Classification Search
USPC ................................... 370/252, 254, 328, 338
See application file for complete search history.

(56) References Cited

U.S. PATENT DOCUMENTS

| | | | |
|---|---|---|---|
| 6,480,528 B1 * | 11/2002 | Patel et al. | 375/148 |
| 2001/0048727 A1 * | 12/2001 | Schmutz et al. | 375/345 |
| 2004/0151264 A1 * | 8/2004 | Montojo et al. | 375/345 |
| 2008/0219332 A1 * | 9/2008 | Brehler | 375/219 |
| 2010/0080327 A1 * | 4/2010 | Zhang et al. | 375/345 |
| 2010/0248665 A1 * | 9/2010 | Jonsson et al. | 455/140 |

FOREIGN PATENT DOCUMENTS

| | | |
|---|---|---|
| EP | 1231710 A2 | 8/2002 |
| EP | 1583232 A2 | 10/2005 |

* cited by examiner

*Primary Examiner* — Hong Cho
(74) *Attorney, Agent, or Firm* — Murphy, Bilak & Homiller, PLLC

(57) ABSTRACT

A technique for performing Automatic Gain Control (AGC) in a multi-carrier communication system in which transmission gaps are scheduled on a serving carrier to enable temporary tuning to another carrier by a served device is described. A method embodiment of this technique comprises: performing a first AGC procedure in relation to a first signal received on a first carrier during a first transmission gap; determining an AGC configuration for a second procedure based on at least one of channel conditions in relation to the first carrier and a lapsed time since the first transmission gap; and determining if the second AGC procedure can be skipped.

32 Claims, 7 Drawing Sheets

TECHNIQUE FOR AUTOMATIC GAIN CONTROL IN A MULTI-CARRIER COMMUNICATION SYSTEM

TECHNICAL FIELD

The present disclosure relates to multi-carrier communication systems. In particular, an Automatic Gain Control (AGC) technique for a multi-carrier communication system is described. AGC is generally used for scaling a received signal such that the resulting signal samples can be represented by a limited number of bits without significant loss of information.

BACKGROUND

Modern multi-carrier communication systems such as the Universal Mobile Telecommunications System (UMTS) and the Long Term Evolution (LTE) system standardized by the $3^{rd}$ Generation Partnership Project (3GPP) are configured to provide transmission gaps on a serving carrier. The transmission gaps may be exploited by a device served on the serving carrier to temporarily tune to another carrier for cell search procedures, signal power measurements and other purposes. During the transmission gaps, no dedicated signalling is performed on the serving carrier in relation to the served device, and no signalling on the serving carrier is expected from the served device.

When, for example, the device is served on a UMTS Terrestrial Radio Access Network (UTRAN) carrier and intends to conduct measurements on an Evolved UTRAN (E-UTRAN) carrier, it is guaranteed a transmission gap (or "measurement gap") of at least 6.6 ms, with a repetition period of up to 120 ms. For the transmission gap the explicit purpose "E-UTRAN measurement" will be signalled on the serving carrier to the served device.

When the device is served on an E-UTRAN carrier and intends to conduct measurements on another carrier (of the same or a different Radio Access Technology, RAT), it is guaranteed a measurement gap of 6 ms. In this case, no measurement purpose is signalled. Instead, the device has to schedule its measurement activities dependent on the number of carriers to be investigated. Up to 7 frequency layers may have to be monitored to this end by the device besides the one for the serving cell (intra-carrier), including carriers at other frequencies (inter-carriers) and carriers of a different RAT (inter-RAT carriers).

Detection of E-UTRAN cells is facilitated by synchronization signals transmitted on the Primary Synchronization Channel (P-SCH) and the Secondary Synchronization Channel (S-SCH) every 5 ms. Moreover, Reference Symbol Received Power (RSRP) measurements may be performed for cell detection or other purposes based on reference symbols transmitted in at least some of the sub-frames.

Figure 1:
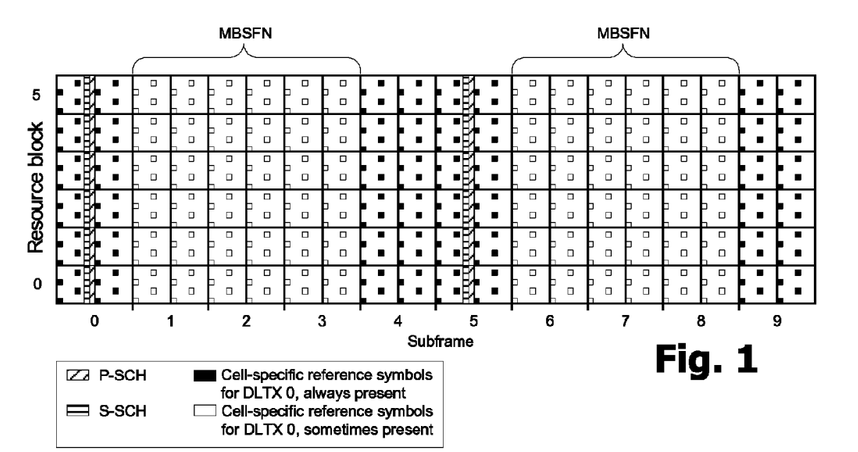
FIG. 1 illustrates the transmission of synchronization signals and reference symbols in an FDD mode of an E-UTRAN.
Figure 2:
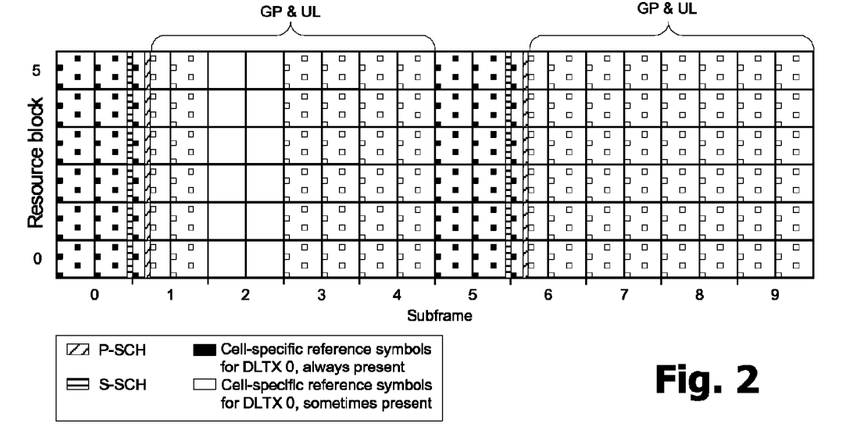
FIG. 2 illustrates the transmission of synchronization signals and reference symbols in a TDD mode of an E-UTRAN.

FIG. 1 exemplarily illustrates the timing of synchronization signals and reference symbols in a Frequency Division Duplex (FDD) mode of an E-UTRAN (only the central 72 sub-carriers are shown). As indicated in FIG. 1, some of the sub-frames may be used for Multimedia Broadcast Multicast Service (MBMS) over a Single Frequency Network (MBSFN) transmission and may thus not contain cell-specific reference symbols. FIG. 2 exemplarily illustrates the transmission of synchronization signals and reference symbols in a Time Division Duplex (TDD) mode of an E-UTRAN (again only the central 72 sub-carriers are shown). As indicated in FIG. 2, some of the sub-frames or parts thereof may be used as Guard Periods (GPs) and for UpLink (UL) transmission, and may thus not contain any cell-specific reference symbols.

Since the synchronization signals transmitted in an E-UTRAN have a repetition period of 5 ms, approximately 5.12 to 5.35 ms of effective radio time is required during a transmission gap to reliably detect a cell that has an arbitrary frame timing. It is readily apparent that a longer effective radio time also permits more accurate RSRP measurements because more reference symbols will become available. In an E-UTRAN with transmission gaps of 6 ms the effective radio time is, however, often less than 5 ms due to the time required for tuning the radio front end to the carrier of interest and the AGC settling time. Such a situation is depicted in FIG. 3.

Figure 3:
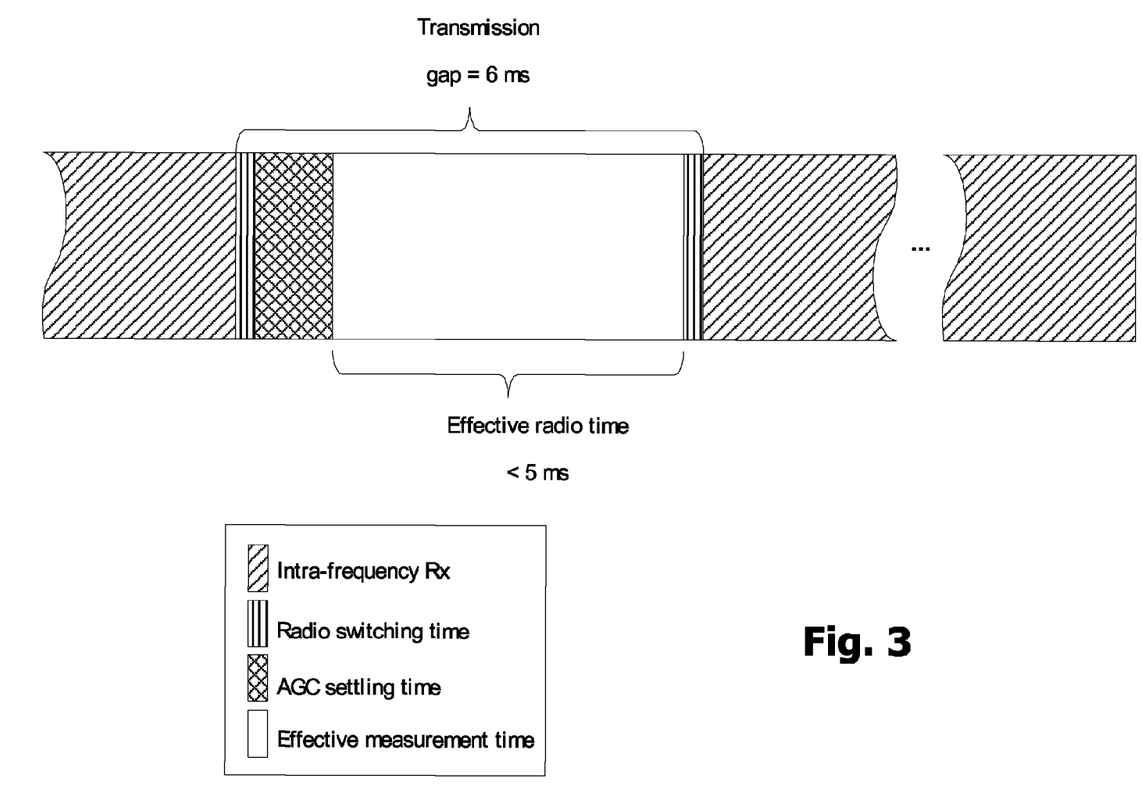
FIG. 3 illustrates a relationship between a nominal transmission gap duration and the effective radio time during the transmission gap.

In the situation illustrated in FIG. 3, cells with unfavourable frame timing will be impossible to detect with conventional E-UTRAN cell search procedures. Moreover, the accuracy of RSRP measurements will be lowered in cases in which tuning to the carrier of interest and settling of the AGC takes long. For example, if there is a large difference between the expected signal strength and the actual signal strength, the gain correction of AGC will generally consume a larger portion of the transmission gap than in a scenario with a small difference.

In order to extend the effective radio time for a given transmission gap duration, one could think of representing the received signal samples with significantly more bits such that information loss is prevented in the case of inaccurate gain settings. Additionally, the dynamic range of analog receiver parts may be increased. However, these approaches would require more memory resources and a more sophisticated receiver design, and would thus lead to increased cost.

EP 1 583 232 A2 discloses an AGC device and an AGC method for allowing the device to quickly converge and become stabilized when the tuning frequency of a radio receiver is switched a plurality of times in a short period of time as in a case of frequency monitoring using the compressed mode.

SUMMARY

It is an object underlying the present disclosure to extend the effective radio time during transmission gaps of a multi-carrier communication system.

According to one aspect, a method of performing AGC in a multi-carrier communication system in which transmission gaps are scheduled on a serving carrier to enable temporary tuning to another carrier by a served device is provided, wherein the method comprises a plurality of steps performed by the served device including performing a first AGC procedure in relation to a first signal received on a first carrier during a first transmission gap, wherein the first AGC procedure delivers a first gain value; determining an AGC configuration for a second AGC procedure based on at least one of channel conditions in relation to the first carrier and a lapsed time since the first transmission gap (e.g. based on channel conditions in relation to the first carrier and/or a lapsed time since the first transmission gap), the determination comprising selecting a specific AGC algorithm or a specific AGC parameter or specific AGC parameter set; and performing the second AGC procedure in relation to a second signal received on the first carrier during a second transmission gap, wherein the second AGC procedure is based on the AGC configuration using the first gain value as a starting point.

According to a further aspect, a method of performing AGC in a multi-carrier communication system in which transmission gaps are scheduled on a serving carrier to enable temporary tuning to another carrier by a served device is provided, wherein the method comprises a plurality of steps performed by the served device including performing a first AGC procedure in relation to a first signal received on a first carrier during a first transmission gap, wherein the first AGC procedure delivers a first gain value; determining that a second AGC procedure in relation to a second signal received on the first carrier during a second transmission gap can be skipped, wherein the determination is based on channel conditions in relation to the first carrier and/or a lapsed time since the first transmission gap; and skipping the second AGC procedure using the first gain value for the second signal.

The AGC configuration may be defined by one or multiple AGC parameters or one or multiple AGC algorithms. In one implementation, the step of determining the AGC configuration comprises a selection procedure. The selection procedure may relate to a specific AGC algorithm or a specific AGC parameter or AGC parameter set. As an example, determining the AGC configuration may comprise selecting either a regular or an optimized (e.g., fast) AGC algorithm dependent on at least one of the channel conditions and the lapsed time (e.g. dependent on the channel conditions or the lapsed time or both).

The lapsed time may be defined in a number of different ways and may generally be representative of approximately the time period between two transmission gaps that correspond to subsequent visits to the same carrier (e.g., to the first carrier). The respective reference points in time may be the start or end of the respective transmission gaps, or any well-defined point in time between the start and the end of the respective transmission gaps (e.g., the point in time at which a particular AGC procedure is performed).

The first gain value delivered by the first AGC procedure for the first carrier may be stored. Upon a later (e.g., the next) visit to the first carrier, the first gain value may be retrieved again. Once retrieved, the first gain value may be used as a starting point for the second AGC procedure (or, if the second AGC procedure is skipped, the first gain value may simply be re-used for the second signal on the first carrier). If during multiple transmission gaps multiple carriers different from the serving carrier are visited, for each visited carrier a dedicated gain value may be stored, retrieved and re-used upon revisiting the specific carrier later on. Generally, the first, second or any further carrier different from the serving carrier may be an intra-carrier, an inter-carrier or an inter-RAT-carrier.

In one implementation a time variability of the channel conditions is derived in relation to the first or any additional channel different from the serving channel. The time variability may, for example, be derived from a coherence time or a Doppler-spread of the respective channel. The determination of the AGC configuration for the second AGC procedure (or the determination of the possibility to skip the second AGC procedure) may then be based on both the time variability and the lapsed time.

The determination of the AGC configuration or that the second AGC procedure can be skipped may be based on an estimated gain difference parameter relating to the first AGC procedure and the second AGC procedure (e.g., relating to the difference between the first gain value and an estimated second gain value delivered by the second AGC procedure that may be skipped). The gain difference parameter may be estimated based on the channel conditions and/or the lapsed time, and the parameter may be taken into account when determining the AGC configuration or when deciding about skipping the upcoming AGC procedure.

The gain difference parameter may, for example, be indicative of a maximum amount the gain is estimated to change from the first AGC procedure to the second AGC procedure in any direction. Accordingly, a gain difference parameter of, for instance, 3 dB (in the sense of an absolute value) indicates that the gain is estimated (or expected) to change from the measurement gap relating to the first AGC procedure to the measurement gap relating to the second AGC procedure by at most 3 dB in any direction (i.e., from +3 dB to −3 dB with respect to the first gain value derived by the first AGC procedure). Accordingly, the actual gain may change by only 1 dB, but even a 3 dB change would, in this example, allow to skip the second AGC procedure or to select an optimized AGC algorithm.

In one configuration, the time variability of the channel conditions in relation to the first or any further channel different from the serving channel is derived by estimation. In such a configuration, the gain difference parameter may be estimated based on the estimated time variability and the lapsed time.

The channel conditions may be derived based on one or more parameters. Such parameters may include at least one of a velocity of the served device, a Doppler-spread in relation to the served device, a channel power profile, a cell bandwidth, or estimates thereof.

The second transmission gap may immediately follow the first transmission gap. In an alternative scenario, there exists at least one third transmission gap between the first transmission gap and the second transmission gap. In the latter scenario the method may further comprise the step of performing a third AGC procedure (or skipping the third AGC procedure) for a third signal received during the third transmission gap on a second carrier different from the first carrier and the serving carrier.

The received signal may be any predetermined signal (i.e., any signal having a predetermined timing, format and/or content). As an example, the received signal may be a synchronization signal or a reference signal (i.e., a signal carrying reference symbols).

The tuning to individual carriers different from the serving carrier during individual transmission gaps may be scheduled in advance. As an example, the scheduling may be performed such that tuning to the same carrier occurs during consecutive or nearby transmission gaps. As understood herein, nearby transmission gaps are transmission gaps separated from each other by at most a predefined number of intermediate transmission gaps (e.g., one, two, three, four or five intermediate transmission gaps). Additionally, or in the alternative, the scheduling may be performed such that consecutive tunings to the same carrier do not exceed a predefined time interval. In general, the scheduling may be performed taking into account one or more of the following parameters: channel conditions, Radio Resource Control (RRC) measurement configuration or re-configuration, performance requirements, and cell search timing requirements.

The scheduling may be performed in accordance with multiple predefined scheduling schemes. In such an implementation, the scheduling may comprise selecting one of the predefined scheduling schemes and visiting the individual carriers during the individual transmission gaps in accordance with a pattern defined by selected scheduling scheme. The selection of the scheduling scheme may be performed based on one or more parameters, including at least one of channel conditions, measurement assignments, measurement gap configurations, and performance requirements.

It should be noted that the scheduling features described herein can beneficially be implemented in combination with the AGC aspects described herein. It would, however, also be possible to implement the scheduling features independently and separately from the specific AGC aspects.

The technique presented herein may be realized in the form of software, in the form of hardware or using a combined software/hardware approach. As regards a software aspect, a computer program product comprising program code portions for performing the steps presented herein when the computer program product is executed on the served device is provided. The computer program product may be stored on a computer-readable recording medium such as a memory chip, a CD-ROM, a hard disk, and so on.

As for a first hardware aspect, an apparatus for performing AGC in a multi-carrier communication system in which transmission gaps are scheduled on a serving carrier to enable temporary tuning to another carrier by a served device is provided. The apparatus comprises an AGC component configured to perform an AGC procedure and a selector coupled to the AGC component and configured to determine an AGC configuration for the AGC procedure, the determination comprising selecting a specific AGC algorithm or a specific AGC parameter or a specific AGC parameter set. The AGC component is further configured to perform a first AGC procedure in relation to a first signal received on a first carrier during a first transmission gap, wherein the first AGC procedure delivers a first gain value; and to perform a second AGC procedure in relation to a second signal received on the first carrier during a second transmission gap, wherein the second AGC procedure uses the first gain value as a starting point and is based on an AGC configuration determined by the selector based on channel conditions in relation to the first carrier and/or a lapsed time since the first transmission gap.

According to a second hardware aspect, an apparatus for performing AGC in a multi-carrier communication system in which transmission gaps are scheduled on a serving carrier to enable temporary tuning to another carrier by a served device is provided, wherein the apparatus comprises an AGC component configured to perform an AGC procedure and a determinator coupled to the AGC component and configured to determine that an AGC procedure can be skipped based on channel conditions in relation to the first carrier and/or a lapsed time since the first transmission gap. The AGC component is also configured to perform a first AGC procedure in relation to a first signal received on a first carrier during a first transmission gap, wherein the first AGC procedure delivers a first gain value; and to skip, under control of the determinator, a second AGC procedure in relation to a second signal received on the first carrier during a second transmission gap. The apparatus is further configured to use the first gain value for the second signal when the second AGC procedure is skipped.

The apparatus of any of the two aspects described above may further comprise a memory configured to store at least the first gain value. The AGC component may then be further adapted to read the first gain value from the memory and utilize the first gain value read from the memory. In one implementation, the memory is further configured to store one or more additional gain values pertaining to one or more additional carriers different from the serving carrier.

The apparatus of any of the two aspects described above may additionally comprise a scheduler configured to schedule tuning to individual carriers during individual transmission gaps. The scheduler may operate in accordance with any of the scheduling approaches described herein. In the case the scheduler is operated in accordance with one of multiple predefined scheduling schemes, the corresponding scheduling schemes may be stored in the memory together with or separately from the one or more gain values.

The apparatus may be incorporated in the served device. Moreover, the apparatus may be comprised by a mobile terminal such as a mobile telephone, a smartphone, a data or network card, or a portable computer. The mobile terminal may be compliant with Release R8 or higher of the 3GPP specifications.

BRIEF DESCRIPTION OF THE DRAWINGS

Further aspects and advantages of the technique presented herein will become apparent from the following description of preferred embodiments and the drawings, wherein.

DETAILED DESCRIPTION

In the following description of preferred embodiments, for purposes of explanation and limitation, specific details are set forth (such as particular configurations, sequences of steps and RATs) in order to provide a thorough understanding of the present disclosure. It will be apparent to one skilled in the art that the technique presented herein may be practiced in other embodiments that depart from these specific details. For example, while the embodiments will primarily be described in the context of third and fourth generation mobile communication systems according to the UMTS and LTE standards, respectively, it will be evident that the technique presented herein can also be practiced in connection with other communication technologies.

Moreover, those skilled in the art will appreciate that the services, functions and steps explained herein below may be implemented using software functioning in conjunction with a programmed microprocessor, an Application Specific Integrated Circuit (ASIC), a Digital Signal Processor (DSP) or a general purpose computer. It will also be appreciated that while the following embodiments will primarily be described in the context of methods and devices, the present disclosure may also be embodied in a computer program product as well as in a system comprising a computer processor and a memory coupled to the processor, wherein the memory is encoded with one or more programs that may perform the services, functions and steps disclosed herein.

Figure 4:
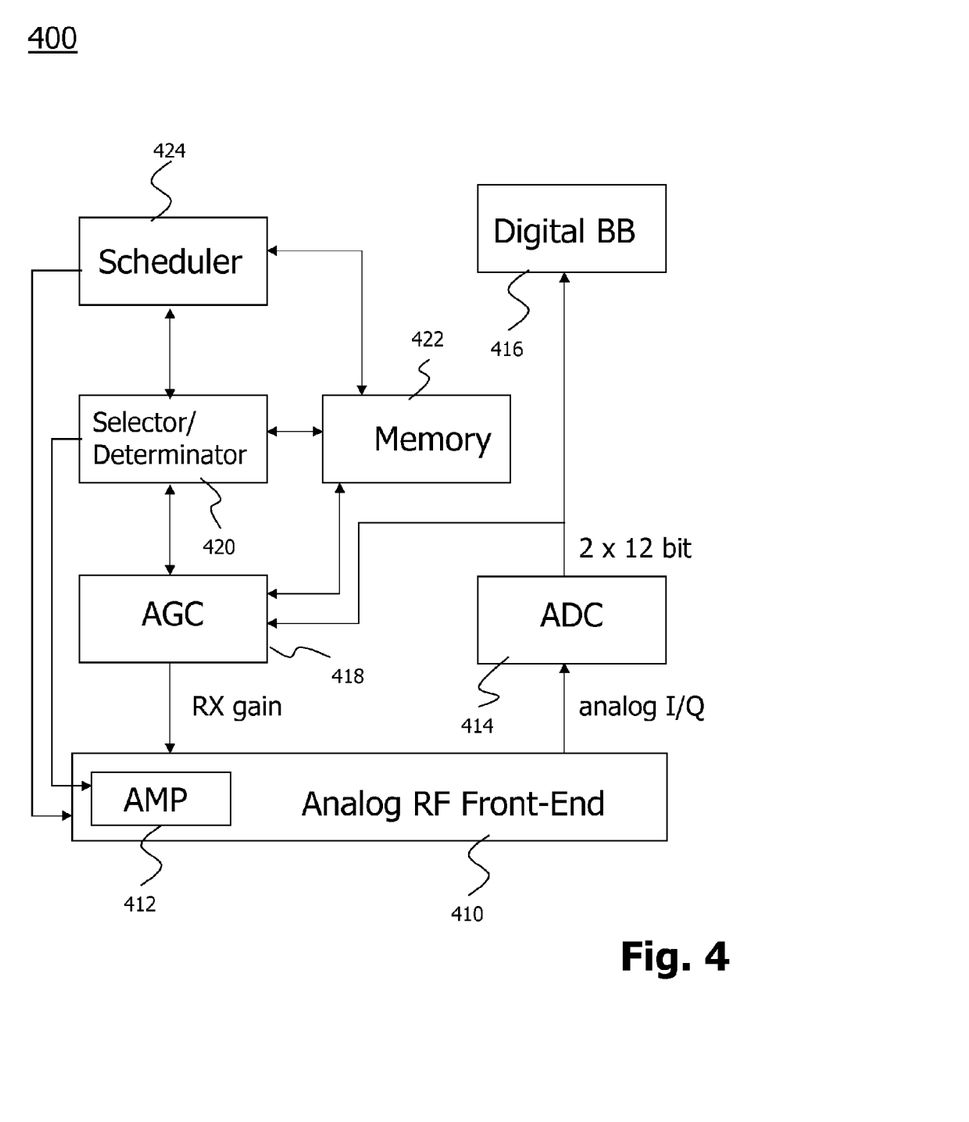
FIG. 4 illustrates an embodiment of an apparatus for performing AGC and for measurement scheduling.

FIG. 4 illustrates an embodiment of an apparatus 400 for performing AGC and for measurement scheduling in a multi-carrier communication system conforming, for example, to the UMTS or LTE standard. The apparatus 400 may be incorporated in a mobile terminal such as a mobile telephone.

As shown in FIG. 4, the apparatus 400 comprises an analog Radio Frequency (RF) front-end 410 with an amplifier 412 having an adjustable gain. The analog RF front-end 410 is configured to be tuneable to different carriers under control of a scheduling scheme.

The analog RF front-end 410 is coupled to an Analog-to-Digital Converter (ADC) 414. The ADC 414 is fed by the analog RF front-end 410 with a received signal comprising analog in-phase and quadrature-phase (I/Q) components. The ADC 414 converts the received analog signal into two digital signal components corresponding to the I/Q components and having a resolution of, for example, 12 bit each. The digital signal components output by the ADC 414 are fed to a digital baseband processor 416 on the one hand and an AGC component 418 on the other. The digital baseband processor 416 has a conventional configuration and will therefore not be described further here.

The AGC component 418 is configured to adjust the gain setting of the amplifier 412 for the received signals. Specifically, the gain setting is controlled by the AGC component 418 to scale the received signals in the analogue domain such that the digital signal samples output by the ADC 414 can be represented by the limited number of bits (i.e., at a resolution of 12 bits in the present embodiment) without significant loss of information.

The AGC component 418 and, optionally, the amplifier 412 are controlled by a selector/determinator 420. Basically, the selection functionality of the selector/determinator 420 allows to determine an AGC configuration for an upcoming AGC procedure to be performed by the AGC component 418. The determinator functionality of the selector/determinator 420, on the other hand, permits to determine that an upcoming AGC procedure can be skipped. Both functionalities will be described in more detail below.

The selector/determinator 420 is coupled to a memory 422. The memory 422 is configured to store one or more gain values that have been applied by the AGC component 418 during previous AGC procedures. In one exemplary configuration, the memory 422 stores a data structure (e.g., a table) which defines an association between individual carriers and individual gain values. In this manner, a look-up functionality may be implemented to enable a carrier-specific determination of the gain values stored in the memory 422.

The apparatus 400 of FIG. 4 also comprises a scheduler 424 which is configured to schedule tuning to individual non-serving carriers during transmission gaps scheduled on a serving carrier. The scheduler 424 has a corresponding control functionality in relation to the analog RF front-end 410 and additionally communicates with the selector/determinator 420 to this end. In one exemplary realization, the scheduler 424 performs the scheduling in accordance with predefined scheduling schemes. These predefined scheduling schemes may be stored in the memory 422 or any other storage of the apparatus 400.

Figure 5:
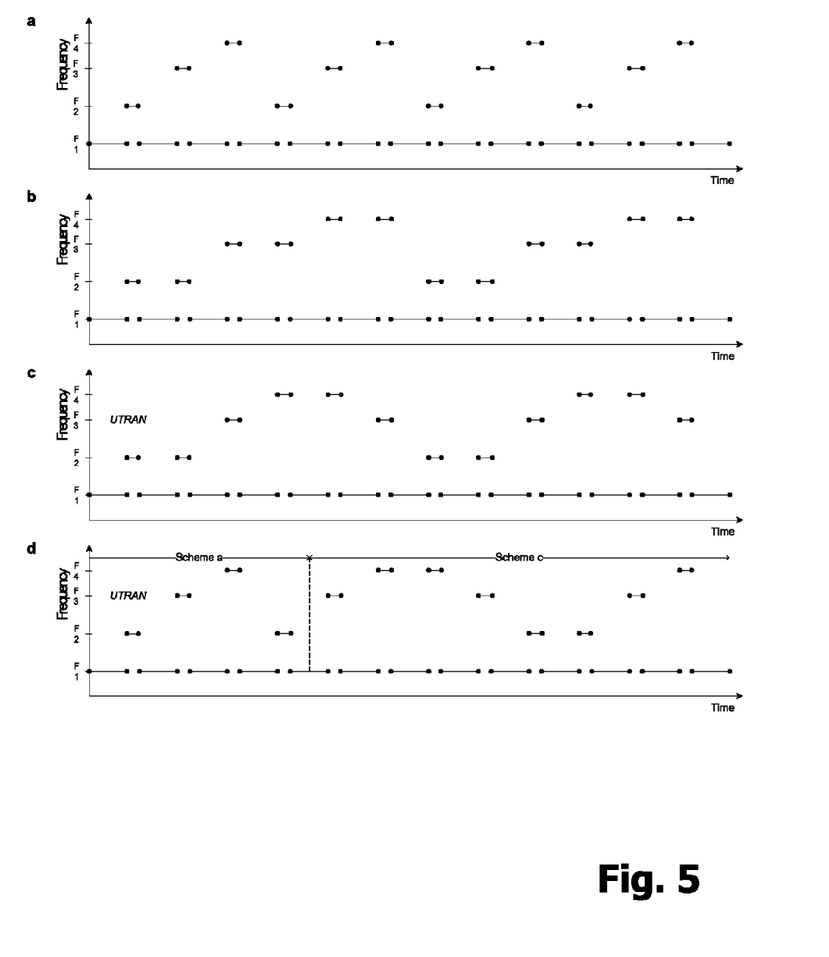
FIG. 5 illustrates embodiments of different scheduling schemes assigning individual carriers to individual transmission gaps.

Three diagrams representative of exemplary scheduling schemes are illustrated in FIGS. 5a, 5b and 5c. In brief, each scheduling scheme defines a temporal pattern in which specific non-serving carriers are (re-)visited during transmission gaps on a serving carrier. In FIG. 5, the serving carrier is indicated in the individual diagrams by F1, and the non-serving carriers that are to be visited during the transmission gaps are indicated by F2, F3 and F4, respectively. It should be noted that FIG. 5 illustrates three non-serving carriers corresponding to three frequency layers to be monitored using measurement gaps. In an exemplary LTE implementation, up to 7 frequency layers may have to be monitored in the context of cell search procedures, signal power measurements and for other purposes.

As becomes apparent from the diagrams of FIGS. 5a, 5b and 5c, the scheduling is performed such that tuning to the same carrier occurs during consecutive or nearby transmission gaps to ensure that two consecutive tunings to the same carrier are close in time. In this manner, the effective radio time during an individual transmission gap can be maximized as will be discussed below.

Figure 6:
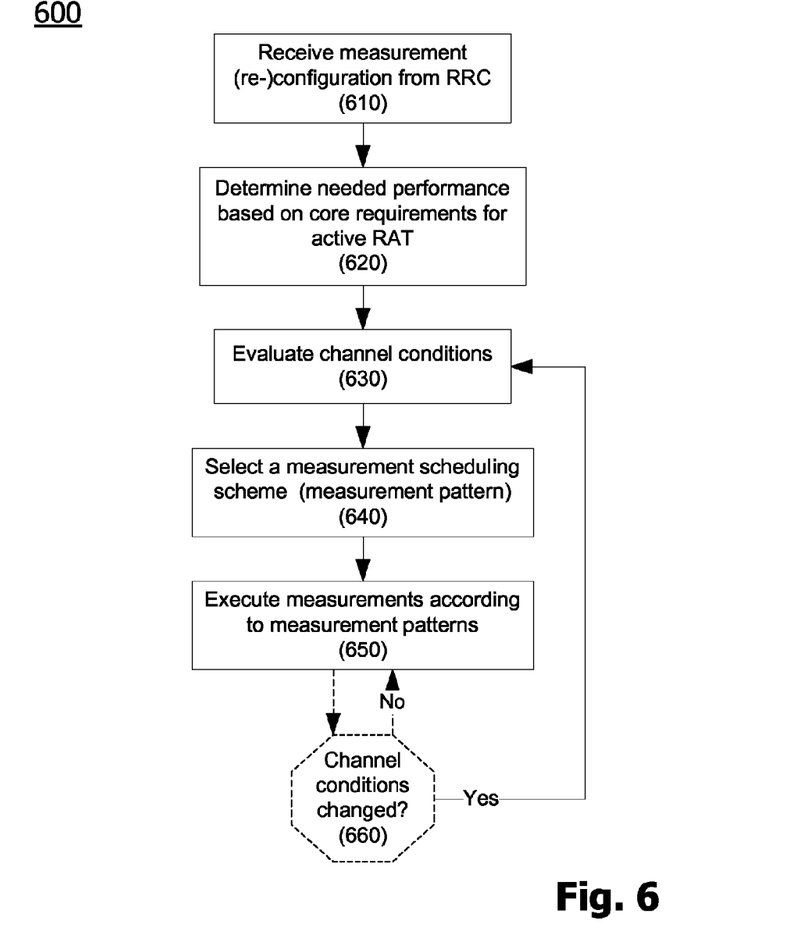
FIG. 6 is a flow chart illustrating a method embodiment of measurement scheduling.
Figure 7:
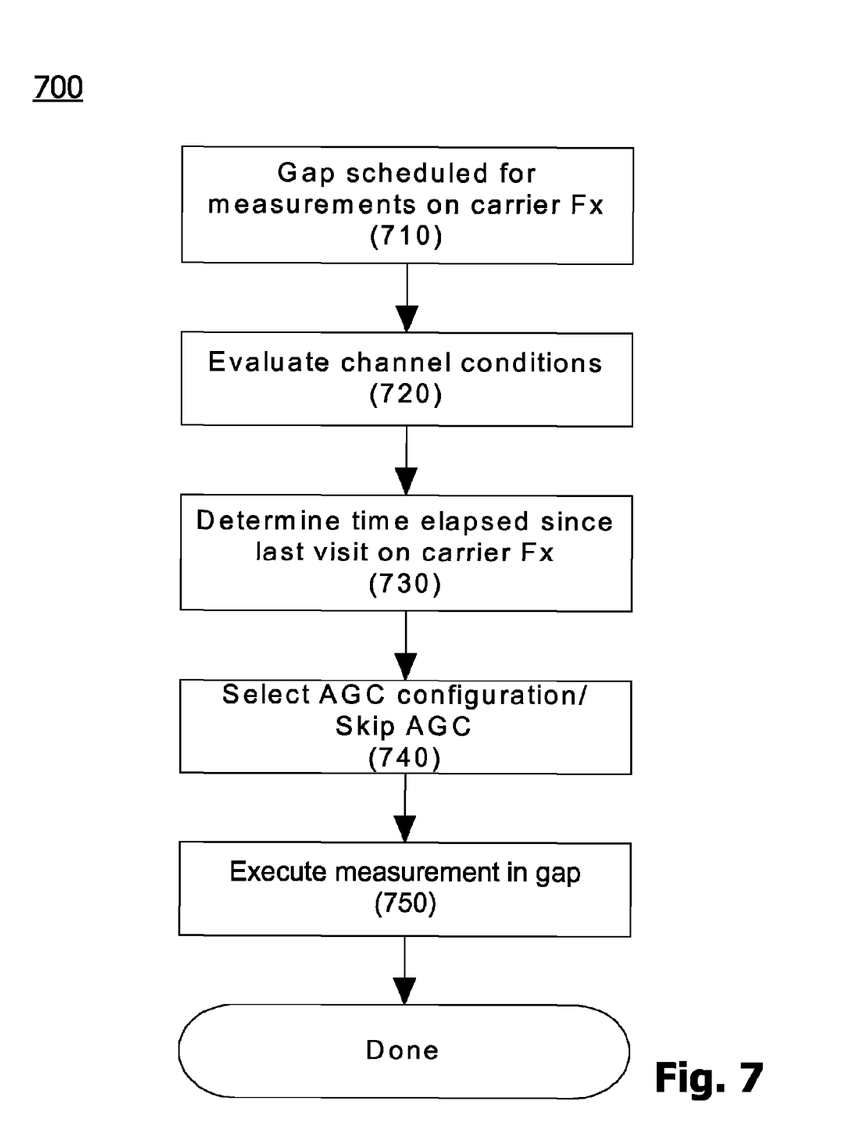
FIG. 7 is a flow chart illustrating a method embodiment of performing AGC.
Figure 8:
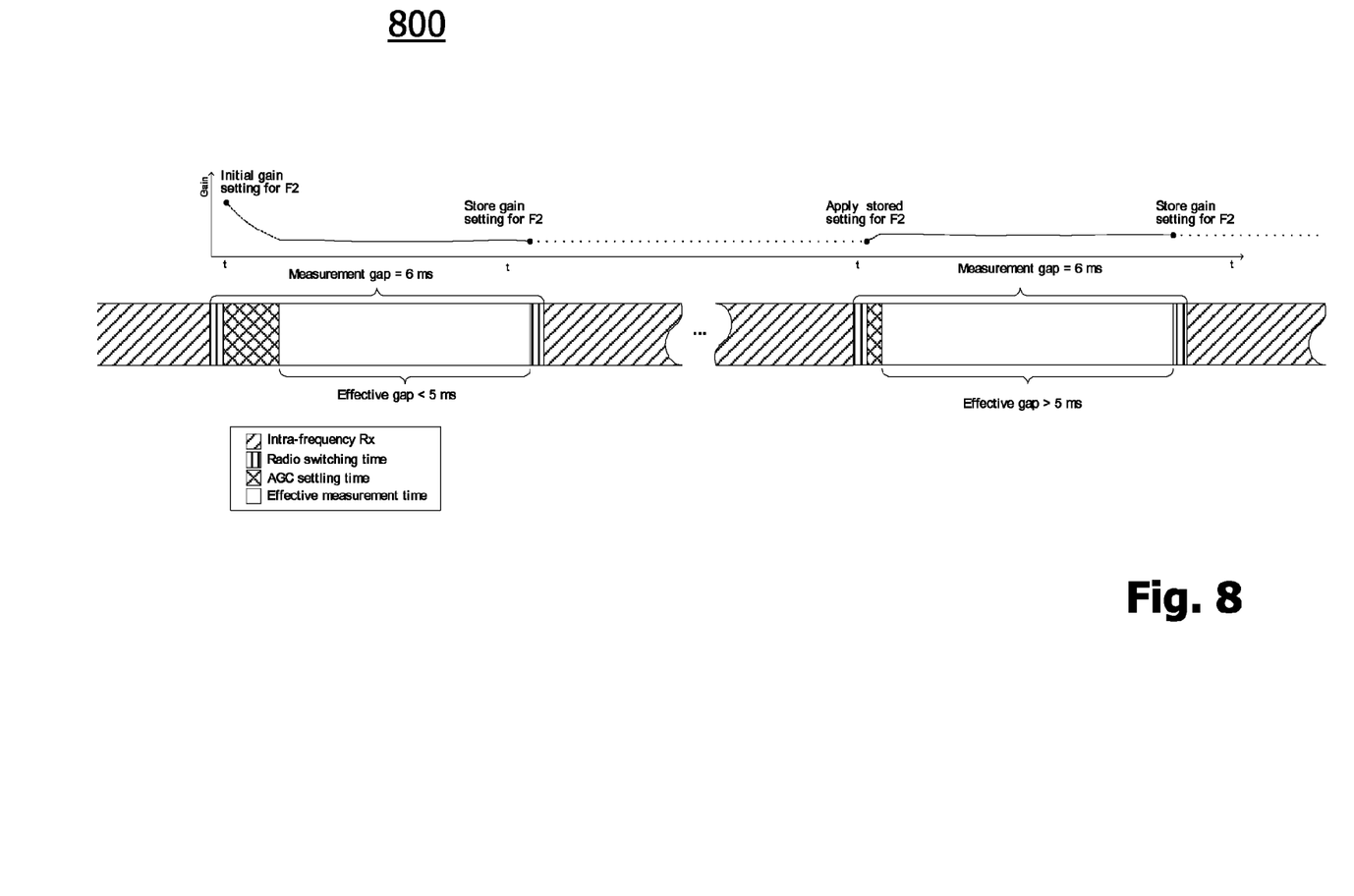
FIG. 8 schematically illustrates a further method embodiment.

In the following, the operation of the apparatus 400 of FIG. 4 will be discussed with reference to the exemplary method embodiments illustrated in FIGS. 6, 7 and 8. These method embodiments generally aim at performing measurements on non-serving UTRAN or E-UTRAN carriers during transmission gaps on a serving E-UTRAN carrier. The measurements may, for example, be performed to detect neighbouring UTRAN or E-UTRAN cells (that may have a transmission behaviour as generally illustrated in FIG. 1 or FIG. 2), for RSRP determination (e.g., in a hand-over context), for detection of synchronization signals (e.g., on the P-SCH and the S-SCH), or other measurement purposes.

The operation of the apparatus 400 during the measurement procedure can basically be divided into two separate operational stages that may be performed independently from each other either in parallel or consecutively. The first stage relates to the selection of a particular scheduling scheme and will be discussed with reference to the exemplary flow diagram 600 of FIG. 6. The second stage corresponds to the determination of a specific gain value to be used during a specific transmission gap and will be explained with reference to the exemplary flow diagram 700 of FIG. 7 and the schematic gain adjustment diagram of FIG. 8.

The operational stage of selecting a specific scheduling scheme (i.e., tuning pattern) by the apparatus 400 will be described first. As illustrated in the flow diagram 600 of FIG. 6, the scheduling operation of the apparatus 400 starts with receipt of a signal indicative of a measurement configuration or measurement re-configuration from RRC by the scheduler 424 in an initial step 610. Then, in a next step 620, the scheduler 424 determines the necessary performance based on the prevailing core requirement settings for the active RAT (i.e., for LTE when the served device comprising the apparatus 400 is attached to an E-UTRAN cell).

Several core requirement settings are defined in Sections 8 and 9 of 3GPP Technical Specification 36.133. Such settings may, for example, relate to the requirement to identify a newly detectable FDD inter-carrier cell, TDD inter-carrier cell, UTRA FDD cell (inter-RAT) or Base Station Identification Code of a GSM cell (inter-RAT). Additionally, or in the alternative, the settings may relate to the requirement to measure FDD inter-carrier cells, TDD inter-carrier cells, or UTRA FDD cells (inter-RAT). Further exemplary requirements relate to a reconfirmation of the Base Station Identification Code of a GSM cell (inter-RAT), to an evaluating of events (e.g., neighbouring cell is becoming stronger than serving cell), and inter-carrier RSRP accuracy.

In step 630, the scheduler 424 evaluates the channel conditions. To this end, one or more of the following parameters indicative of the channel conditions may be evaluated: a velocity of the served device comprising the apparatus 400, a Dopplerspread in relation to the served device, a channel power profile and a cell bandwidth (or estimates thereof). The parameters may be in particular be evaluated with respect to the serving cells since channel analysis is performed anyway on the context of regular data reception. However, it is also possible to additionally, or in the alternative, perform a corresponding channel analysis to one or more inter-carriers.

Depending on the prevailing channel conditions as evaluated in step 630 and the performance requirements as determined in step 620, the scheduler 424 selects a specific scheduling scheme from the multiple scheduling schemes stored in the memory 422 (step 640). Several exemplary scheduling schemes that may be selected have already been discussed above with reference to FIG. 5. In addition to the further prevailing channel conditions and the performance requirements, the selection of a specific scheduling scheme by the scheduler 424 may additionally be based on further parameters such as the current measurement assignments (e.g., the currently applied scheduling scheme) and the current transmission gap configuration.

The rationale behind the selection of a specific scheduling scheme is to maximize the effective radio time on each non-serving carrier to be investigated. To this end, the measurement schemes of FIG. 5 are defined such that the same non-serving carrier will be visited in consecutive or nearby transmission gaps. This approach ensures that the channel conditions will typically not change too severely between two consecutive visits of the same non-serving carrier. As a result, a fast AGC algorithm having a fast settling behaviour (and thus consuming less radio time) can be utilized. The effective radio time during a transmission gap can thus be extended, which permits a reliable cell detection regardless of the cell frame timing. Additionally, due to the extended effective radio time, more reference symbols become available for RSRP measurements.

Once a specific scheduling scheme has been selected in step 640, the selected scheduling scheme is utilized in step 650 for the actual measurements (i.e., for the tuning to non-serving carriers to be measured). The selected scheduling scheme is utilized as long as the channel conditions remain approximately constant. When a change in channel conditions is detected in step 660, the method loops back to step 630 to determine whether a different scheduling scheme has to be selected. The transition from one scheduling scheme to another scheduling scheme due to a significant change of the channel conditions is illustrated in FIG. 5d. In the exemplary scenario of FIG. 5d, the scheduler 424 performs a decision to switch from the scheduling scheme of FIG. 5a to the scheduling scheme of FIG. 5c.

In the following, the tuning to non-serving carriers, the execution of measurements and the associated AGC procedures (step 650 in FIG. 6) will be described in more detail with reference to the flow diagram 700 of FIG. 7 and the gain setting diagram 800 of FIG. 8. It will be assumed in the following that the scheduler 424 has selected either a scheduling scheme starting with a measurement on non-serving carrier F2. It will further be assumed that for the first measurement on carrier F2 (corresponding to the first transmission gap in FIGS. 5a, 5b and 5c) a first AGC procedure had been performed that delivered a first gain value (or "gain setting") for carrier F2, and that this first gain value had been stored in memory 422 for the carrier F2. As illustrated on the left-hand side of FIG. 8, the initial AGC procedure has consumed a significant amount of time because the initial gain value used by the AGC component 418 as a starting point strongly deviated from the final gain value derived by the first AGC procedure and stored for carrier F2 in the memory 422. The resulting extended AGC settling time has led to a situation in which the effective radio time (or "effective gap") is shorter than 5 ms (see FIG. 8).

In the following, the determination of a gain value in relation to carrier F2 for the fourth transmission gap in FIG. 5a and the second transmission gap in FIGS. 5b and 5c will be described in more detail with reference to the flow diagram 700 of FIG. 7 and for the gain setting scenario illustrated in FIG. 8. In a first step 710, the scheduler 424 determines, based on the selected scheduling scheme, that a further measurement on carrier F2 is scheduled for the upcoming transmission gap (i.e., for the fourth transmission gap in FIG. 5a or the second transmission gap in FIGS. 5b and 5c). Then, in step 720, the scheduler 424 of the selector/determination 420 evaluates the prevailing channel conditions in relation to the carrier F2. To this end, one or more of the following parameters may be taken into account: a velocity of the served device comprising the apparatus 400, a Doppler spread in relation to the served device, a channel power profile and a cell bandwidth (or estimates thereof).

In one exemplary implementation, step 720 comprises deriving a time variability of the channel conditions in relation to the channel F2. The time variability may be derived from the coherence time of the channel F2, which is inversely proportional to the Doppler spread. The Doppler spread is defined as $f_d = v \cdot f/c$, wherein v is the velocity of the served device, f is the carrier frequency and c is the speed of light. The velocity of the served device may either be measured or estimated.

In the following step 730, the time lapsed since the last visit on carrier F2 (i.e., since the first transmission gap in FIGS. 5a, 5b and 5c) is determined. The start points or end points of the respective transmission gaps or any other suitable events may be used as temporal reference points for the determination in step 730.

Then, in step 740, the selector/determinator 420 either selects a specific AGC configuration or determines that AGC can be completely skipped for the upcoming transmission gap. Specifically, the selector/determinator 420 associates the time variability estimated in step 720 with the lapsed time determined in step 730 to determine a parameter indicative of how large the gain difference between the gain value of the first AGC procedure as stored in the memory 412 and the optimal gain value ("second gain value") for the upcoming (second) AGC procedure in relation to carrier F2 is expected to be. Based on the estimated gain difference parameter, the selector/determinator 420 either determines that the AGC procedure for the upcoming transmission gap can be fully skipped or, in the alternative, selects a specific AGC configuration if the AGC procedure cannot be skipped.

As an example, the gain difference parameter may indicate a maximum expected deviation between the first gain value and the second gain value in either direction. Therefore, an estimated gain difference parameter of 3 dB indicates that the gain is expected to change from the first AGC procedure to the upcoming second AGC procedure by a most 3 dB (i.e., the second gain value is at most 3 dB larger or smaller than the first gain value). The gain difference parameter may linearly or otherwise increase with the distance in time between the measurement gaps pertaining to the first AGC procedure and the second AGC procedure, respectively.

In general, the determinator functionality of the selector/determinator 420 will determine that an upcoming AGC procedure can be skipped if the estimated (maximum) gain difference does not exceed a predefined gain difference threshold. In such a situation, the previously stored gain value for the carrier F2 will be read from the memory 422 and directly passed to the amplifier 412, which will apply the previously stored gain value also for the measurement on carrier F2 during the upcoming transmission gap (step 750) without any involvement of the AGC component 418.

If, on the other hand, the determinator functionality of the selector/determinator 420 determines that the AGC procedure for the upcoming transmission gap cannot be skipped, an AGC algorithm tailored to handle the estimated (maximum) gain difference while minimizing the AGC settling time is selected by the selector functionality of the selector/determinator 420. As an example, the selector functionality may select a fast AGC algorithm consuming less radio time if the estimated (maximum) gain difference only slightly trespasses the gain difference threshold. Otherwise, the selector functionality may select a regular AGC algorithm. The selected AGC algorithm is then communicated to the AGC component 418, which performs an AGC procedure in relation to the signal received on carrier F2 during the upcoming transmission gap in accordance with the selected AGC algorithm (step 750).

The resulting AGC procedure performed by the AGC component 418 uses the gain value previously stored for carrier F2 in the memory 422 as a starting point. Since the applicable scheduling scheme has been devised such that the channel conditions will not change to much between subsequent visits of the same carrier, it can be expected that the previously stored gain value comes close to the optimal gain value for the upcoming transmission gap. For this reason, the AGC settling time can be kept low as illustrated in FIG. 8 for the second transmission gap. The low AGC settling time, in turn, ensures that the effective radio time during the transmission gap is significantly longer than 5 ms in the exemplary LTE scenario. As has already been explained, an effective radio time of significantly more than 5 ms permits in an LTE scenario a reliable detection also of E-UTRAN cells having an unfavourable frame timing. Moreover, the number of reference symbols received during the transmission gap can be maximized when maximizing the effective radio time.

Once the measurement in step 750 has been completed, the resulting gain value derived by the current AGC procedure will be stored again for a re-use during the next visit to carrier F2. While the present embodiment has only been described with reference to carrier F2, it will be appreciated that the gain values will be stored and re-used in a similar manner also for the remaining non-serving carriers (i.e., carriers F3 and F4 in FIG. 5).

As has become apparent from the above description of various embodiments, the technique presented herein generally allows, for a given performance requirement, to use a simpler receiver design and fewer bits to represent signals provided for cell search, measurements, and similar purposes. As a result, hardware cost and power consumption can be reduced. These advantageous aspects result from the generally increased effective radio time during transmission gaps.

The increased effective radio time permits to receive more reference symbols for RSRP measurements, which increases measurement accuracy. An increased measurement accuracy is particularly important in certain TDD configurations of E-UTRAN cells and when MBFSN is used as generally illustrated in FIG. 1. In these situations, reference symbols are carried in only very few sub-frames.

The increased effective radio time further allows the served device to detect cell with arbitrary frame timing without requiring a more complex receiver design for a higher ADC resolution. This aspect is particularly important for multi-carrier communication systems with infrequent synchronization or similar signals (e.g., in LTE scenarios in which pilot signals are discontinuously transmitted and synchronization information is only available once every 5 ms). In particular the following two LTE scenarios can be handled more efficiently.

When an FDD carrier (see FIG. 1) is visited, cells having a frame timing within a particular timing range relative to the transmission gap may even systematically be punished (i.e., become "invisible") since the AGC first has to settle before cell search can be carried out, and the effective radio time available may be too short for the synchronization signals to repeat. The technique presented herein allows to substantially increase the effective radio time (at least) the second time the same carrier is visited, thus allowing the served device to detect cells having an arbitrary frame timing.

When a TDD carrier (see FIG. 2) is visited with first time, the served device has no knowledge of which parts of the signal received during the transmission gap belongs to uplink and downlink transmissions on the visited carrier. Because the power of uplink and downlink sub-frames might be different, it will be difficult for the AGC algorithm to settle quickly when not implementing the technique presented herein, thus reducing the effective radio time to a value below 5 ms.

The scheduling mechanism presented herein also permits a more flexible operation of the served device in LTE and similar multi-carrier communication systems in which no specific measurement purpose is signalled. This situation puts more responsibility on the served device to fulfill the measurement accuracy specified in the core requirements. Clearly, the responsibility can more easily be handled using a particular scheduling scheme defining, for example, the sequence of inter-RAT (e.g., GSM, WCDMA, LTE) measurements. Moreover, since LTE measurements typically use a limited number of bits (4 bits for cell search and 8 bits for RSRP measurements in an exemplary implementation) LTE measurements are more sensitive to low AGC accuracy than, for example, WCDMA measurements.

It will be appreciated by those skilled in that art that the embodiments described above may be adapted or extended in various ways. Accordingly, the scope of the invention is defined solely by the claims that follow and the elements recited therein.

The invention claimed is:

1. A method of performing Automatic Gain Control (AGC) in a multi-carrier communication system in which transmission gaps are scheduled on a serving carrier to enable temporary tuning to another carrier by a served device, the method comprising the following steps performed by the served device:
   performing a first AGC procedure in relation to a first signal received on a first carrier during a first transmission gap, wherein the first AGC procedure delivers a first gain value;
   determining an AGC configuration for a second AGC procedure based on channel conditions in relation to the first carrier or based on a lapsed time since the first transmission gap, or both, the determination comprising selecting a specific AGC algorithm or a specific AGC parameter or a specific AGC parameter set; and
   performing the second AGC procedure in relation to a second signal received on the first carrier during a second transmission gap, wherein the second AGC procedure is based on the AGC configuration using the first gain value as a starting point.

2. The method of claim 1, further comprising deriving a time variability of the channel conditions in relation to the first channel, wherein the determination is based on the time variability and the lapsed time.

3. The method of claim 1, further comprising estimating a gain difference parameter relating to the first AGC procedure and the second AGC procedure based on the channel conditions or based on the lapsed time, or both, wherein the determination of the AGC configuration is based on the estimated gain difference parameter.

4. The method of claim 1, further comprising:
   deriving a time variability of the channel conditions in relation to the first channel, wherein the determination is based on the time variability and the lapsed time;

estimating a gain difference parameter relating to the first AGC procedure and the second AGC procedure based on the channel conditions or based on the lapsed time, or both, wherein the determination of the AGC configuration is based on the estimated gain difference parameter; wherein the time variability is derived by estimation and wherein the gain difference parameter is estimated based on the estimated time variability and the lapsed time.

5. The method of claim 1, wherein the second transmission gap immediately follows the first transmission gap.

6. The method of claim 1, wherein there exists at least one third transmission gap between the first transmission gap and the second transmission gap, the method further comprising performing a third AGC procedure for a third signal received during the third transmission gap on a second carrier different from the first carrier and the serving carrier.

7. The method of claim 1, further comprising deriving the channel conditions based on at least one of a velocity of the served device, a Doppler spread in relation to the served device, a channel power profile and a cell bandwidth, or estimates thereof.

8. The method of claim 1, wherein the received signal is a reference signal, a synchronization signal, or another predetermined signal.

9. The method of claim 1, further comprising scheduling a tuning to individual carriers during individual transmission gaps.

10. The method of claim 9, wherein the scheduling is performed such that tuning to the same carrier occurs during consecutive or nearby transmission gaps.

11. The method of claim 9, wherein the scheduling is performed such that consecutive tunings to same carrier do not exceed a predefined time interval.

12. The method of claim 9, wherein the scheduling is performed in accordance with a selected one of two or more predefined scheduling schemes.

13. The method of claim 9, wherein the scheduling is performed taking into account one or more of the following parameters: channel conditions, Radio Resource Control measurement configuration or re-configuration, performance requirements, and cell search timing requirements.

14. A non-transitory computer-readable medium comprising a computer program stored thereupon, the computer program comprising program code portions for performing the steps of claim 1 when the computer program product is executed on the served device.

15. A method of performing Automatic Gain Control (AGC) in a multi-carrier communication system in which transmission gaps are scheduled on a serving carrier to enable temporary tuning to another carrier by a served device, the method comprising the following steps performed by the served device:
performing a first AGC procedure in relation to a first signal received on a first carrier during a first transmission gap, wherein the first AGC procedure delivers a first gain value;
determining that a second AGC procedure in relation to a second signal received on the first carrier during a second transmission gap can be skipped, wherein the determination is based on channel conditions in relation to the first carrier and/or a lapsed time since the first transmission gap; and
skipping the second AGC procedure using the first gain value for the second signal.

16. The method of claim 15, further comprising deriving a time variability of the channel conditions in relation to the first channel, wherein the determination is based on the time variability and the lapsed time.

17. The method of claim 15, further comprising estimating a gain difference parameter relating to the first AGC procedure and the second AGC procedure based on the channel conditions or based on the lapsed time, or both, wherein the determination that the second AGC procedure can be skipped is based on the estimated gain difference parameter.

18. The method of claim 15, further comprising:
deriving a time variability of the channel conditions in relation to the first channel, wherein the determination is based on the time variability and the lapsed time;
estimating a gain difference parameter relating to the first AGC procedure and the second AGC procedure based on the channel conditions or based on the lapsed time, or both, wherein the determination that the second AGC procedure can be skipped is based on the estimated gain difference parameter;
wherein the time variability is derived by estimation and wherein the gain difference parameter is estimated based on the estimated time variability and the lapsed time.

19. The method of claim 15, wherein the second transmission gap immediately follows the first transmission gap.

20. The method of claim 15, wherein there exists at least one third transmission gap between the first transmission gap and the second transmission gap, the method further comprising performing a third AGC procedure for a third signal received during the third transmission gap on a second carrier different from the first carrier and the serving carrier.

21. The method of claim 15, further comprising scheduling a tuning to individual carriers during individual transmission gaps.

22. The method of claim 21, wherein the scheduling is performed such that tuning to the same carrier occurs during consecutive or nearby transmission gaps.

23. The method of claim 21, wherein the scheduling is performed such that consecutive tunings to same carrier do not exceed a predefined time interval.

24. The method of claim 21, wherein the scheduling is performed in accordance with a selected one of two or more predefined scheduling schemes.

25. An apparatus for performing Automatic Gain Control, or AGC, in a multi-carrier communication system in which transmission gaps are scheduled on a serving carrier to enable temporary tuning to another carrier by a served device, the apparatus comprising:
an AGC component configured to perform an AGC procedure; and
a selector coupled to the AGC component and configured to determine an AGC configuration for the AGC procedure, the determination comprising selecting a specific AGC algorithm or a specific AGC parameter or a specific AGC parameter set;
wherein the AGC component is further configured
to perform a first AGC procedure in relation to a first signal received on a first carrier during a first transmission gap, wherein the first AGC procedure delivers a first gain value; and
to perform a second AGC procedure in relation to a second signal received on the first carrier during a second transmission gap, wherein the second AGC procedure uses the first gain value as a starting point and is based on an AGC configuration determined by the selector based on channel conditions in relation to the first carrier or based on a lapsed time since the first transmission gap, or both.

26. The apparatus of claim 25, further comprising a memory configured to store the first gain value, and wherein the AGC component is further adapted to read the first gain value from the memory and utilize the first gain value read from the memory.

27. The apparatus of claim 25, further comprising a scheduler configured to schedule tuning to individual carriers during individual transmission gaps.

28. A mobile terminal comprising the apparatus of claim 25, wherein the mobile terminal is compliant with Release 8 or higher of the 3GPP specifications.

29. An apparatus for performing Automatic Gain Control, or AGC, in a multi-carrier communication system in which transmission gaps are scheduled on a serving carrier to enable temporary tuning to another carrier by a served device, the apparatus comprising:

an AGC component configured to perform an AGC procedure; and a determinator coupled to the AGC component and configured to determine that an AGC procedure can be skipped based on channel conditions in relation to the first carrier or based on a lapsed time since the first transmission gap, or both;

wherein the AGC component is further configured to perform a first AGC procedure in relation to a first signal received on a first carrier during a first transmission gap, wherein the first AGC procedure delivers a first gain value; and to skip, under control of the determinator, a second AGC procedure in relation to a second signal received on the first carrier during a second transmission gap; and wherein the apparatus is configured to use the first gain value for the second signal.

30. The apparatus of claim 29, further comprising a memory configured to store the first gain value, and wherein the AGC component is further adapted to read the first gain value from the memory and utilize the first gain value read from the memory.

31. The apparatus of claim 29, further comprising a scheduler configured to schedule tuning to individual carriers during individual transmission gaps.

32. A mobile terminal comprising the apparatus of claim 29, wherein the mobile terminal is compliant with Release 8 or higher of the 3GPP specifications.

* * * * *